United States Patent
Nodake

(10) Patent No.: US 7,298,212 B2
(45) Date of Patent: Nov. 20, 2007

(54) AUTOMATIC LEVEL CONTROL CIRCUIT WITH IMPROVED ATTACK ACTION

(75) Inventor: Yasuhiro Nodake, Ora-gun (JP)

(73) Assignee: Sanyo Electric Co., Ltd., Osaka (JP)

(*) Notice: Subject to any disclaimer, the term of this patent is extended or adjusted under 35 U.S.C. 154(b) by 152 days.

(21) Appl. No.: 11/187,281

(22) Filed: Jul. 22, 2005

(65) Prior Publication Data

US 2006/0017507 A1  Jan. 26, 2006

(30) Foreign Application Priority Data

Jul. 23, 2004  (JP) .............................. 2004-216235

(51) Int. Cl.
   *H03G 3/30*  (2006.01)
(52) U.S. Cl. ...................... 330/279; 330/129; 330/141; 330/278
(58) Field of Classification Search ................ 330/129, 330/141, 278, 279, 281
   See application file for complete search history.

(56) References Cited

U.S. PATENT DOCUMENTS 5,423,081 A * 6/1995 Thiele et al. ................ 330/279
6,670,849 B1 * 12/2003 Damgaard et al. .......... 330/129
7,164,315 B2   1/2007 Camnitz et al.

FOREIGN PATENT DOCUMENTS

JP           11-328855           11/1999

OTHER PUBLICATIONS

English Patent Abstract of JP11328855 from esp@cenet, published Nov. 30, 1999, 1 page.

* cited by examiner

*Primary Examiner*—Khanh Van Nguyen
(74) *Attorney, Agent, or Firm*—Osha Liang LLP

(57) ABSTRACT

An automatic level control circuit comprises a gain controllable amplifier, a comparing and outputting circuit which compares a level of an output signal from the gain controllable amplifier with a reference level and outputs a result of comparison as a comparison result signal; an output signal restricting circuit which restricts the comparison result signal obtained in a period between one zero crossing point and another zero crossing point of the input signal such that a portion of the comparison result signal obtained within a predetermined output time is output, and an attack detecting and outputting circuit which restricts an output signal from the comparing and outputting circuit to the portion of the comparison output signal obtained within the predetermined time when the comparison result signal is output over the predetermined output time and outputs the restricted comparison result signal as an attack detection output signal.

5 Claims, 6 Drawing Sheets ns are relatively long, an interval
AUTOMATIC LEVEL CONTROL CIRCUIT WITH IMPROVED ATTACK ACTION The entire disclosure of Japanese Patent Application No. 2004-216235 including the specification, claims, drawings, and abstract is incorporated herein by reference.

CROSS REFERENCE TO RELATED APPLICATIONS

This application contains subject matter that may be related to that contained in the following U.S. application Ser. No. 11/187,185 filed on Jul. 22, 2005, and assigned to the assignee of the instant application: "Automatic Level Control Circuit With Improved Recovery Action"

BACKGROUND OF THE INVENTION

1. Field of the Invention

The present invention relates to an ALC (Automatic Level Control) circuit for automatically adjusting the gain of an amplifier to establish an output signal level from the amplifier at a predetermined level.

2. Description of the Related Art

Many electronic cameras, such as a digital camera, a digital video camera, or the like, have a sound recording capability to record audio input through a microphone and a moving image recording capability to record moving images. Such an electronic camera having a sound recording capability generally includes a circuit for automatically adjusting the gain of an amplifier installed in a stage prior to a recording stage in accordance with a level of an input audio signal when the sound is recorded.

FIG. 6 shows an automatic level control circuit in a digital detection system using a programmable gain amplifier. In the automatic level control circuit of FIG. 6, an input audio signal amplified by a programmable gain amplifier 10 is converted from an analog signal into a digital signal by an analog/digital converter (an A/D converter) 20 installed in a stage after the programmable gain amplifier 10. Next, the level of the digital signal (an output signal level from the programmable gain amplifier 10) is detected by a level detector 30 and then compared with a predetermined reference level. Based on an obtained comparison result, the gain of the programmable gain amplifier 10 is adjusted according to a control signal output from a gain controller 40 to the programmable gain amplifier 10 such that the output audio signal from the programmable gain amplifier 10 (i.e. the input audio signal having been amplified by the programmable gain amplifier 10) is set to a predetermined audio signal level.

More specifically, when the level of the digital signal detected by the level detector 30 is greater than the predetermined reference level, an operation for stepping down the gain of the programmable gain amplifier 10 by one step (an attack action) is performed, whereas an operation for stepping up the gain of the programmable gain amplifier 10 by one step (a recovery action) is performed when the level of the digital output signal is smaller than the predetermined reference level. By continuously repeating such adjustment to the gain achieved by the attack and recovery actions until the level of the digital signal reaches the predetermined reference level, the amplifier gain can be automatically controlled in accordance with the level of the input audio signal at the predetermined reference level, which enables the recording of audio input at a desired audio signal level.

The attack action performed in the automatic level control circuit is generally completed in a short time to minimize an adverse effect that an audio waveform loses its accurate shape due to an excessively large signal beyond a dynamic range. Further, when discrete amplifier gain control is digitally performed in the automatic level control circuit described above, a step which could arise in an output waveform when the gain is modified may become a cause of noise. Therefore, to prevent the occurrence of such a step, modification to the gain achieved by the attack action is generally performed only at a zero crossing time.

However, when the modification to the gain by the attack action is only performed at the zero crossing time, the attacking time varies depending on a signal frequency. Especially when the signal frequency is low and intervals of the zero crossing times are relatively long, an interval between times when the gain is modified is extended, thereby making it difficult to complete the attack action and resulting in a lengthy attacking time (a period of time to decrease the gain).

As a countermeasure to prevent the attacking time from being lengthened, the decrease in gain achieved by the attack action can be computed irrespective of the zero crossing time, with only the operation of outputting a computed result to the programmable gain amplifier limited to performance only at the zero crossing time. However, such a measure will create a problem as described below.

Typically, in the level detector, a comparison between the level of the digital signal and the predetermined reference level is performed at the timing of a clock signal, and, when the comparison result showing that the level of the digital signal is greater than the predetermined reference level is obtained a predetermined number of times in succession, a detection result indicating that the amplifier gain of the programmable gain amplifier should be reduced by one step is obtained. Then, when the above-described situation further continues for the same predetermined number of times, the detection result indicating that the amplifier gain should be reduced by one step is obtained again. At the subsequent zero crossing time, the total number of steps accumulated in the detection results obtained until then is output along with an attack action control signal to instruct reduction of the amplifier gain, to thereby reduce the amplifier gain by an amount equivalent to the total number of steps. When the detection result is obtained three times in a period from a zero crossing time to a subsequent zero crossing time, for example, the amplifier gain will be reduced by three steps at the subsequent zero crossing time.

Here, when the processes of comparison and detection described above are performed in a situation where the interval between the zero crossing times is long, it is likely that the amplifier gain which would be optimally reduced only by one step in the first place is reduced by more than one steps due to accumulation of the number of steps in the detection results obtained until the next zero crossing time. If such excessive reduction is performed, it becomes necessary to perform a recovery action in a subsequent process, which results in unnatural operating conditions.

SUMMARY OF THE INVENTION

The present invention provides an automatic level control circuit comprising a gain controllable amplifier which amplifies an input signal according to an established gain; a comparing and outputting circuit which compares a signal level output from the gain controllable amplifier with a reference level and outputs a compared result as a comparison result signal; an output signal restricting circuit which restricts the comparison result signal obtained between a zero crossing time and the subsequent zero crossing time of the input signal such that a portion of the comparison result signal obtained within a predetermined output time period is output; and an attack detecting and outputting circuit which restricts an output signal from the comparing and outputting circuit to the portion of the comparison result signal obtained within the predetermined output time period when the comparison result signal is output over the predetermined output time period, and outputs the restricted comparison result signal as an attack detection output signal.

BRIEF DESCRIPTION OF THE DRAWINGS

Preferred embodiments of the present invention will be described in detail based on the following figures, wherein.

DESCRIPTION OF THE PREFERRED EMBODIMENTS

Figure 1:
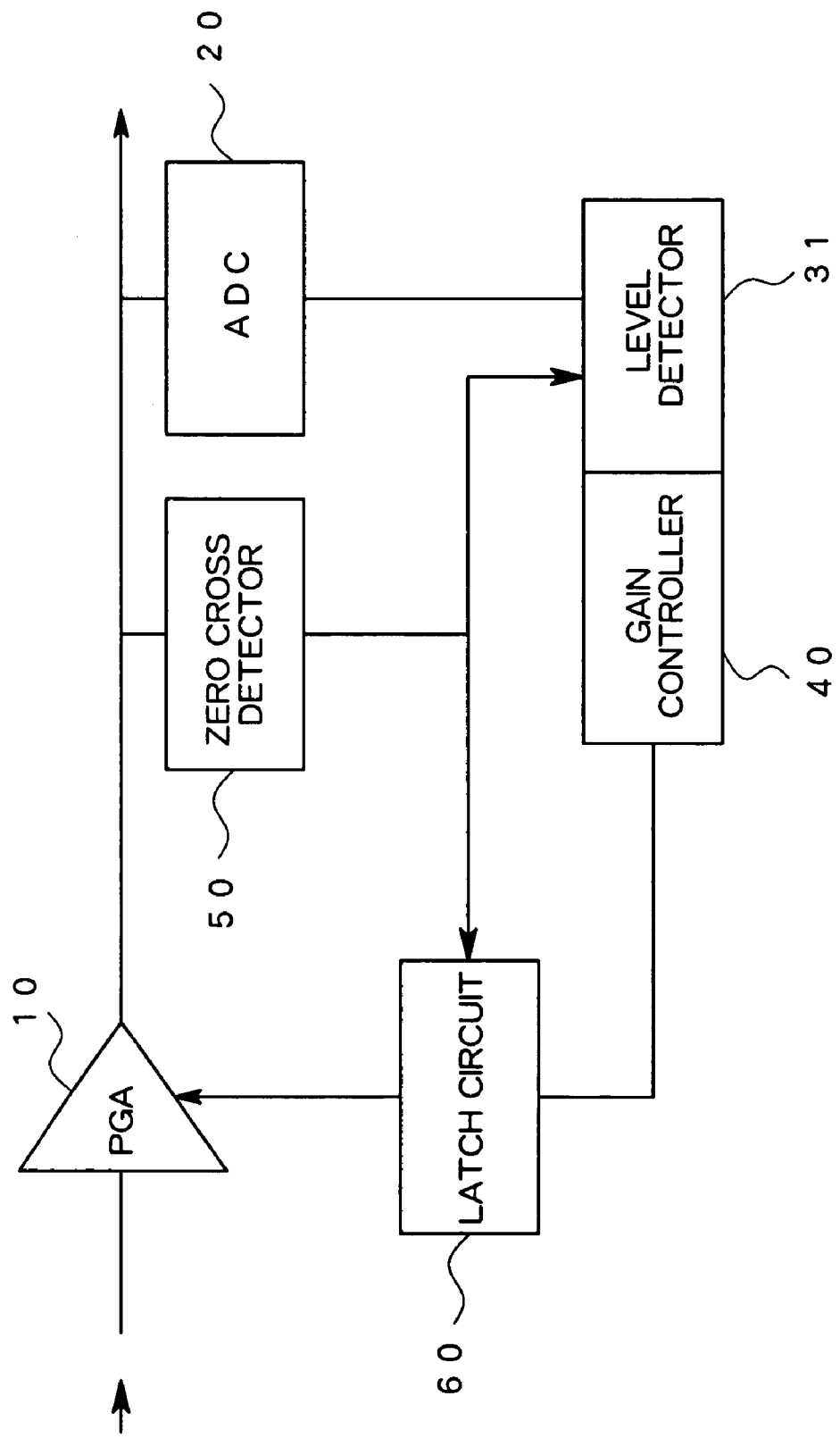
FIG. 1 is a schematic diagram showing a configuration of an automatic level control circuit in a digital detection system using a programmable gain amplifier according to a first embodiment of the present invention.

Referring now to the drawings, a first embodiment of the present invention will be described below.

Figure 2:
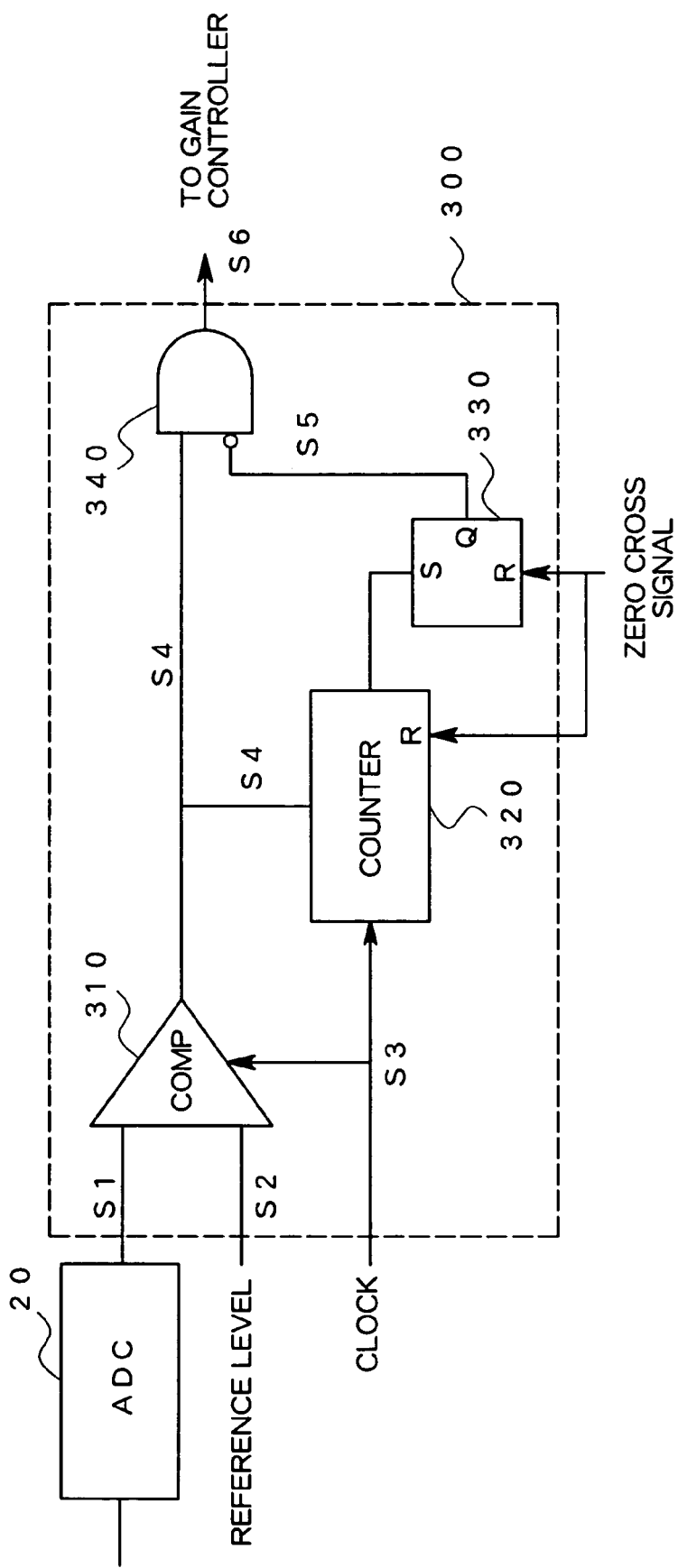
FIG. 2 is a schematic diagram showing a configuration of an attack detecting circuit mounted on a level detector in the automatic level control circuit of FIG. 1.
Figure 3:
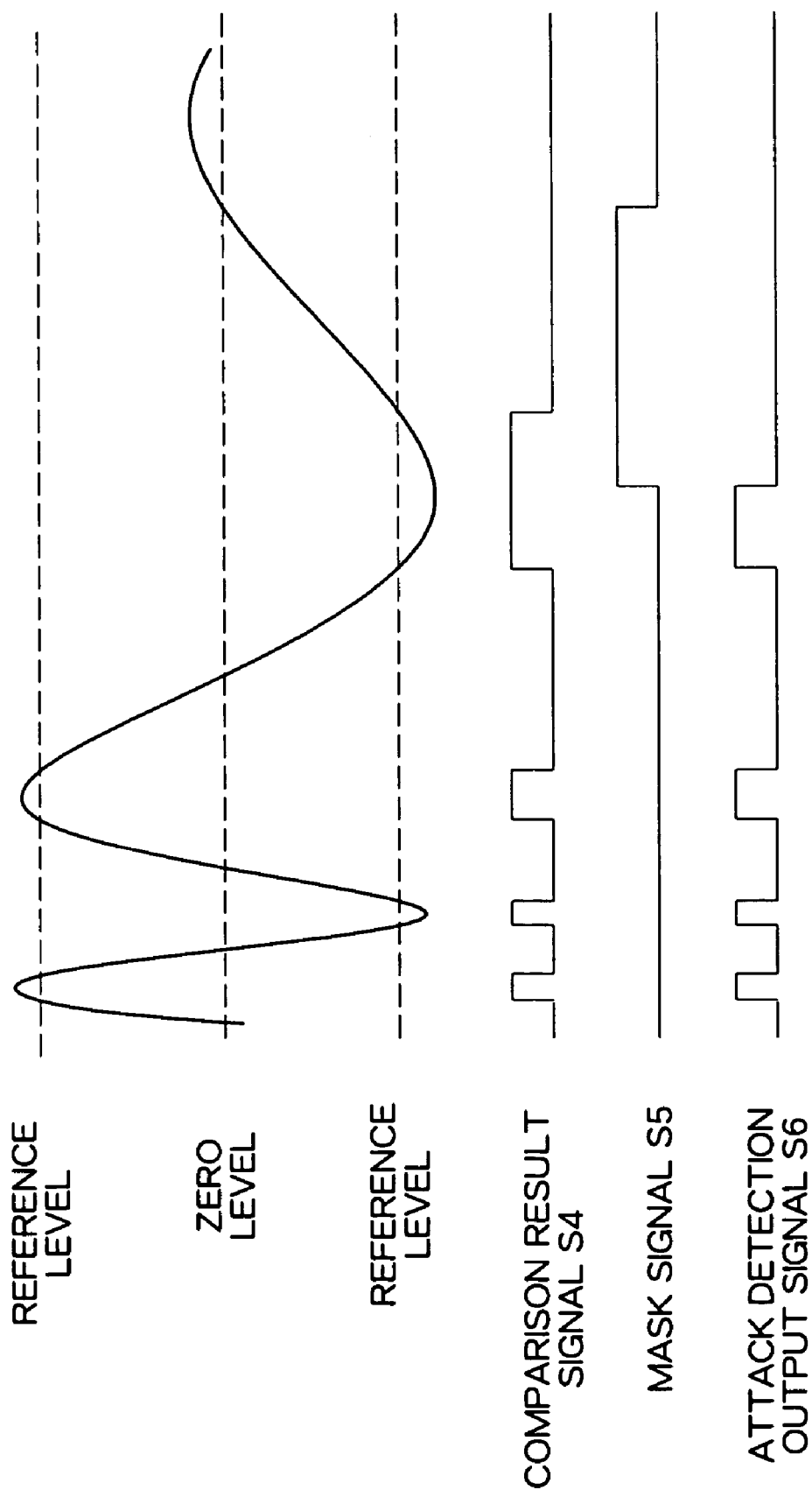
FIG. 3 is a diagram showing a relationship among a comparison result signal, a mask signal, an attack detection signal, and an amplified input audio signal in the attack detecting circuit of FIG. 2.
Figure 6:
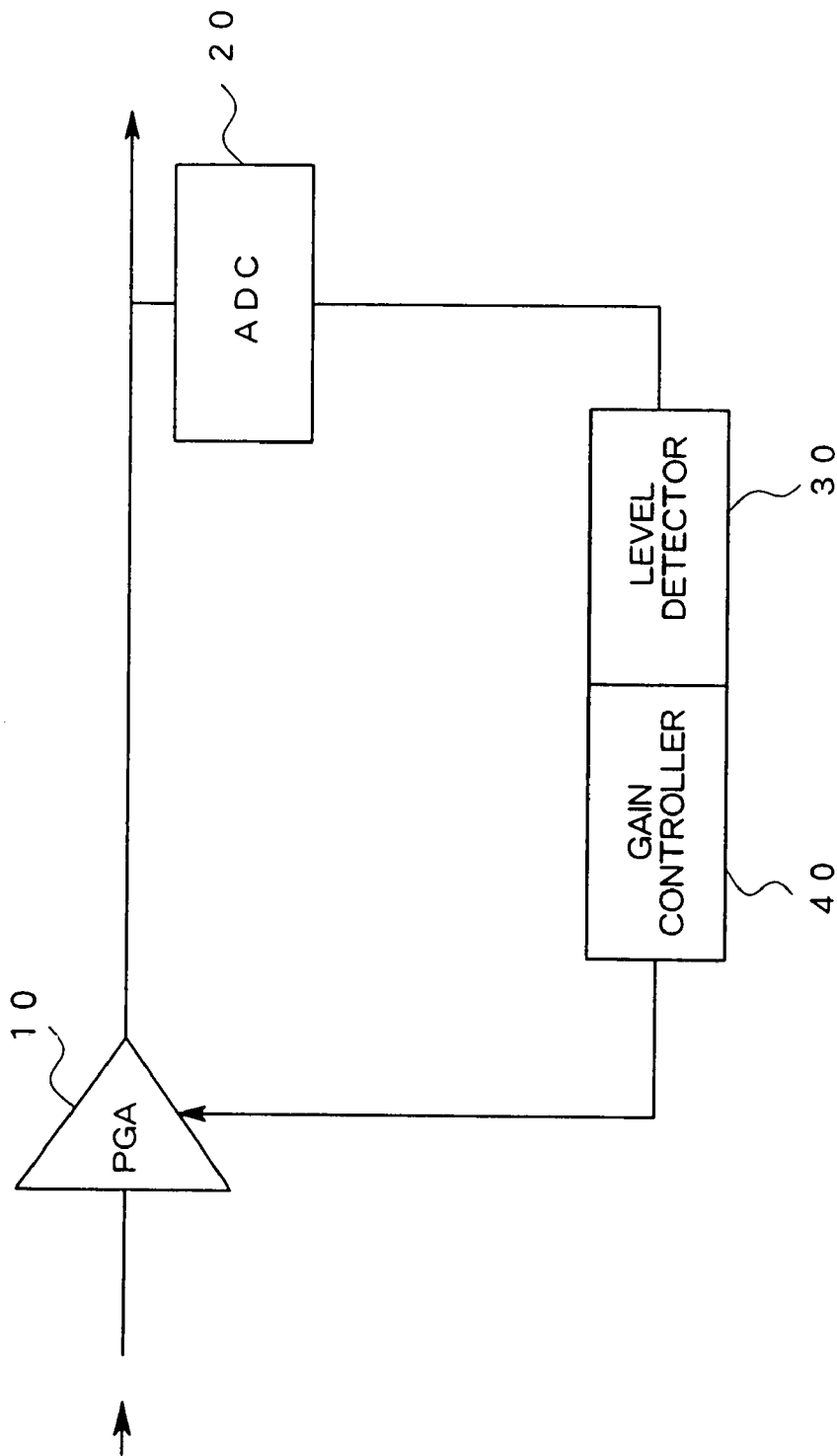
FIG. 6 is a schematic diagram showing a configuration of an automatic level control circuit in digital detection system using a conventional programmable gain amplifier.

FIG. 1 is a circuit diagram of an automatic level control circuit according to the first embodiment of the present invention, and FIG. 2 is a schematic diagram showing a configuration of an attack detecting circuit installed in a level detector of the automatic level control circuit depicted in FIG. 1. Further, FIG. 3 shows a relationship among a comparison result signal, a mask signal, an attack detection signal, and an amplified input audio signal in the attack detecting circuit shown in FIG. 2. In FIG. 1, components corresponding to those in the automatic level control circuit of FIG. 6 are identified by the same reference numerals as those used in FIG. 6.

In the automatic level control circuit of FIG. 1, a zero cross detector 50 and an A/D converter (ADC) 20 are connected in a stage after a programmable gain amplifier 10. The A/D converter 20 converts an input audio signal (an analog signal) which has been amplified in the programmable gain amplifier 10 into a digital signal and outputs the resultant digital signal to a level detector 31.

The level detector 31 detects the level of the digital signal (a signal level output from the programmable gain amplifier 10) and compares the detected level with a predetermined reference level (an attack reference level). When an obtained comparison result shows that the detected level is greater than the attack reference level, a detection result indicating one-step reduction of the gain of the programmable gain amplifier 10 is obtained just as in the related art. Based on the obtained detection result, a control signal, to adjust the gain of the programmable gain amplifier 10 such that the audio signal output from the programmable gain amplifier 10 is set at a predetermined audio signal level, is output from a gain controller 40 to a latch circuit 60. When the level of the digital signal detected in the level detector 31 is greater than the predetermined reference level (the attack reference level), for example, a control signal to provide an instruction for reducing the gain of the programmable gain amplifier 10 by an amount equivalent to the number of steps corresponding to the detection results, in other words, a control signal to provide an instruction for performing the attack action is output.

For example, the gain controller 40 in which a predetermined coefficient is prestored retrieves the detection result stored in a comparator 310 at every fixed point in clock cycle, and performs a subtraction of a value computed by multiplying the coefficient by 1 when the level output from the A/D converter 20 is greater than the reference level, to thereby determine the control signal to adjust the gain of the programmable gain amplifier 10. Specifically, as described in the above related art example, the gain of the programmable gain amplifier 10 is increasingly changed when the output level thereof is low, while the gain is decreasingly changed when the output level is high, thereby controlling the output level so as to be set at a predetermined value. At the attacking time, because the gain of the programmable gain amplifier 10 is established according to the input signal level in a previous stage and a value of the control signal corresponding to the established gain is specified, the value of the control signal will be reduced. More specifically, taking the above-described coefficient as one step, the value of the control signal is reduced, based on the comparison result obtained at a timing of a fixed clock, by an amount equivalent to the number of attack detections multiplied by the coefficient.

On the other hand, the zero cross detector 50 detects zero crossing of the input audio signal (analog signal) amplified in the programmable gain amplifier 10 and outputs a zero cross signal of a detection result to both the level detector 31 and the latch circuit 60 as an H-level signal.

When the zero cross signal (H level) is input to the latch circuit 60, the output signal from the gain controller 40 is retrieved in the latch circuit 60. Then, output from the latch circuit 60 is provided to the programmable gain amplifier 10 as the control signal which determines the gain of the programmable gain amplifier 10, and the attack action for reducing the gain of the programmable gain amplifier 10 according to the control signal is performed. Because the latch circuit 60 does not retrieve another signal unless the zero cross signal (H level) is further input into the latch circuit 60, the condition of the control signal is maintained.

After the zero cross signal (H level) is again input to the latch circuit 60, an attack action control signal which is input from the gain controller 40 to the latch circuit 60 simultaneously with the input of the zero cross signal is output via the latch circuit 60 to the programmable gain amplifier 10, and then the attack action for reducing the gain of the programmable gain amplifier 10 is initiated.

In the present embodiment, the level detector 31 includes an attack detecting circuit 300 for restricting the amount of reduction in gain achieved at the zero crossing time to prevent excessive reduction of the gain of the programmable gain amplifier 10.

FIG. 2 shows a configuration of the attack detecting circuit 300 installed in the level detector 31 of the automatic level control circuit shown in FIG. 1. In the level detector 31, the comparator 310 compares the level of the digital signal S1 received from the A/D converter 20 with the level of the reference level signal S2 (a predetermined reference level) at a timing according to a clock signal S3. In the attack action, a comparison result signal S4 indicating a comparison result that the level of the digital signal S1 is greater than the predetermined reference level is output, as shown in FIG. 3, from the comparator 310 and supplied to an AND circuit 340.

Next, the comparison result signal S4 output from the comparator 310 is counted by a counter 320 at a timing according to a clock signal S3. More specifically, when the level of the output signal from the A/D converter 20 is higher than the reference level, the comparison signal S4 from the comparator 310 is at the H level, and the comparison signal S4 is at the H level on the rising edge of the clock, the counter 320 is incremented by one. If a count of comparison results which is increased at this time reaches the number of comparison results equivalent to the predetermined maximum steps in which the gain can be changed at the zero crossing time, an SR flip flop 330 is set. For example, the counter 320 may be configured to output the H level when the counter 320 is incremented up to the count of comparison results equivalent to the maximum steps.

When the SR flip flop 330 is set according to the output at the H level from the counter 320, the mask signal S5 to be output from the SR flip flop 330 becomes H level as shown in FIG. 3, and an inverted signal of the mask signal S5 is input in the AND circuit 340. Thus, both the comparison result signal S4 from the comparator 310 and the inverted signal of the mask signal S5 are input into the AND circuit 340 in which an AND between the comparison result signal S4 and the inverted signal of the mask signal S5 is obtained. Then, the AND circuit 340 outputs, as a detection result, the attack detection output signal S6 as shown in FIG. 3 to the gain controller 40.

It should be noted that the SR flip flop 330 is configured to be reset by an input of an edge of the zero cross signal (H level) from the zero cross detector 50. Accordingly, the SR flip flop 330 is reset at the subsequent zero crossing time, and, from then on, the normal attack action is repeated until the number of counts registered in the counter 320 reaches the number of comparison results equivalent to the predetermined maximum steps. At the time when the count of comparison results equivalent to the predetermined maximum steps is attained, as described above, the attack detection output signal S6 masked by the mask signal S5 is output to the gain controller 40 as the detection result to restrict the attack action. Further, the number of counts is reset by the zero cross signal in the counter 320.

As described above, according to the attack detecting circuit 300 of FIG. 2, when the number of counts registered in the counter 320 exceeds a predetermined value during an interval between a zero crossing point and a subsequent zero crossing point, the flip flop 330 is set to prohibit the output of the comparison signal S4 from the AND circuit 340. Specifically, when the number of counts in the counter 320 reaches the predetermined count of comparison results equivalent to the gain changeable maximum steps, the attack detection output signal enters the masked state, and is shifted to an L level. In other words, the gain controller 40 cannot detect the attack detection results numbering greater than the predetermined number of the gain changeable maximum steps at the zero crossing time. By restriction the detection results in such a manner, the number of steps in which the gain can be reduced according to the attack action control signal output from the gain controller 40 is limited to within the number of above-described maximum steps irrespective of signal frequencies and intervals between zero crossing points, to thereby prevent excessive reduction in gain of the programmable gain amplifier 10.

In this example, the comparison result signal in the comparator 310 is output from the AND circuit 340 without being further processed. Accordingly, the gain controller 40 evaluates the comparison result signal with respect to a predetermined clock cycle, and reduces the gain of the programmable gain amplifier 10 on a step-by-step basis in a case where the attacking time is indicated by the result of evaluation. Here, it is preferred that the clock in the counter 320 be identical to that in the gain controller 40, which allows the same setting of the predetermined maximum number of gain changeable steps in both the level detector 31 and the gain controller 40. However, as long as a fixed relationship can be maintained between the settings, the two clocks may differ from each other.

Further, by using, as the counter 320, a counter having the maximum count value equal to the number of maximum steps, the count registered in the counter 320 can directly represent the number of steps in which the gain is changed at the zero crossing time. Here, the count in the counter 320 may be supplied to the gain controller 40, and the gain of the programmable gain amplifier 10 may be changed using a value obtained by multiplying the count by a counting value for one step at the attacking time in the gain controller 40.

After the H level of the attack detection output signal S6 output from the AND circuit 340 is thus input in the gain controller 40, a control signal to provide the instruction for reducing the gain of the programmable gain amplifier 10 by the amount equivalent to the steps corresponding to the number of obtained detection results (instruction for performing the attack action) is output, based on the attack detection output signal S6 of the detection result, from the gain controller 40 to the latch circuit 60. Then, in the latch circuit 60, the above-described process is performed in accordance with the input of the zero cross signal.

As described above, in the automatic level control circuit according to the first embodiment of the present invention, an attenuation amount of the gain achieved by the attack action at the zero crossing time is restricted such that the gain cannot be changed beyond the predetermined number of maximum steps. Therefore, with such a restriction in place, excessive reduction in gain of the programmable gain amplifier 10 can be prevented, enabling the attack action to perform suitable gain adjustment.

Although the present invention has been described with reference to the first embodiment, it will be understand that the configuration described is provided as one example, and that any circuit configurations capable of realizing the technical concept of restricting the attack action when the count of comparison results reaches a value equivalent to the predetermined number of maximum steps may be used to realize the present invention.

Further, while the automatic level control circuit according to the first embodiment of the present invention has a structure in which an analog output from the programmable gain amplifier 10 is digitally converted for level detection, and the analog output is provided to the stages after the programmable gain amplifier 10, the structure of the automatic level control circuit, however, is not limited to the above-described structure. For example, the analog output may be provided from the programmable gain amplifier 10 only to the A/D converter 20 in which the analog signal is converted into the digital signal, and the digital signal converted in the A/D converter 20 may be output to the level detector 31 in addition to providing digital output to the stages after the A/D converter 20.

Figure 4:
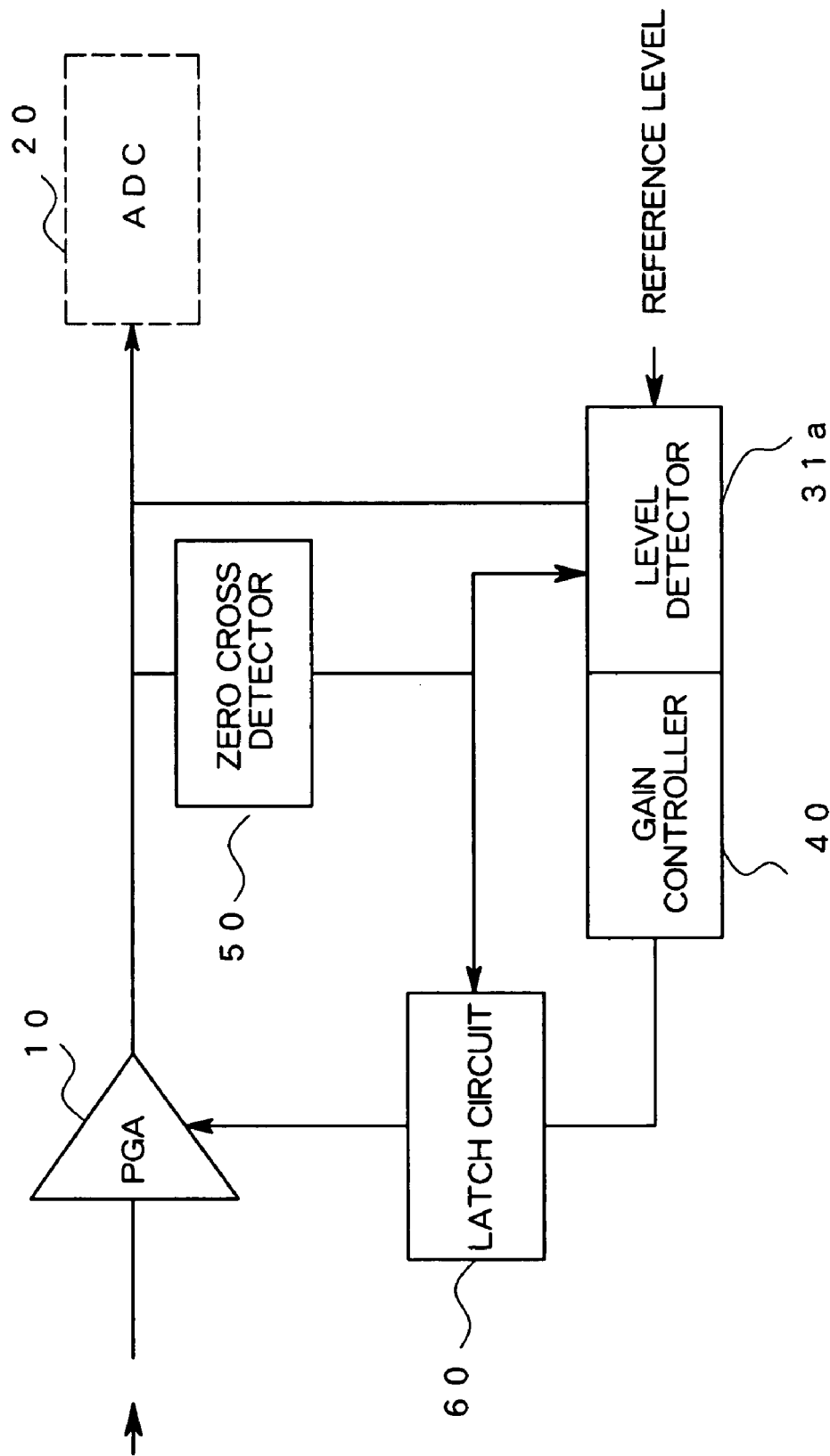
FIG. 4 is a schematic diagram showing a configuration of an automatic level control circuit in a digital detection system using a programmable gain amplifier according to a second embodiment of the present invention.

Further, even an automatic level control circuit in which the analog signal from the programmable gain amplifier 10 is input in the level detector 31a as shown in FIG. 4, for example, can produce effects similar to those obtained by the automatic level control circuit according to the first embodiment.

Figure 5:
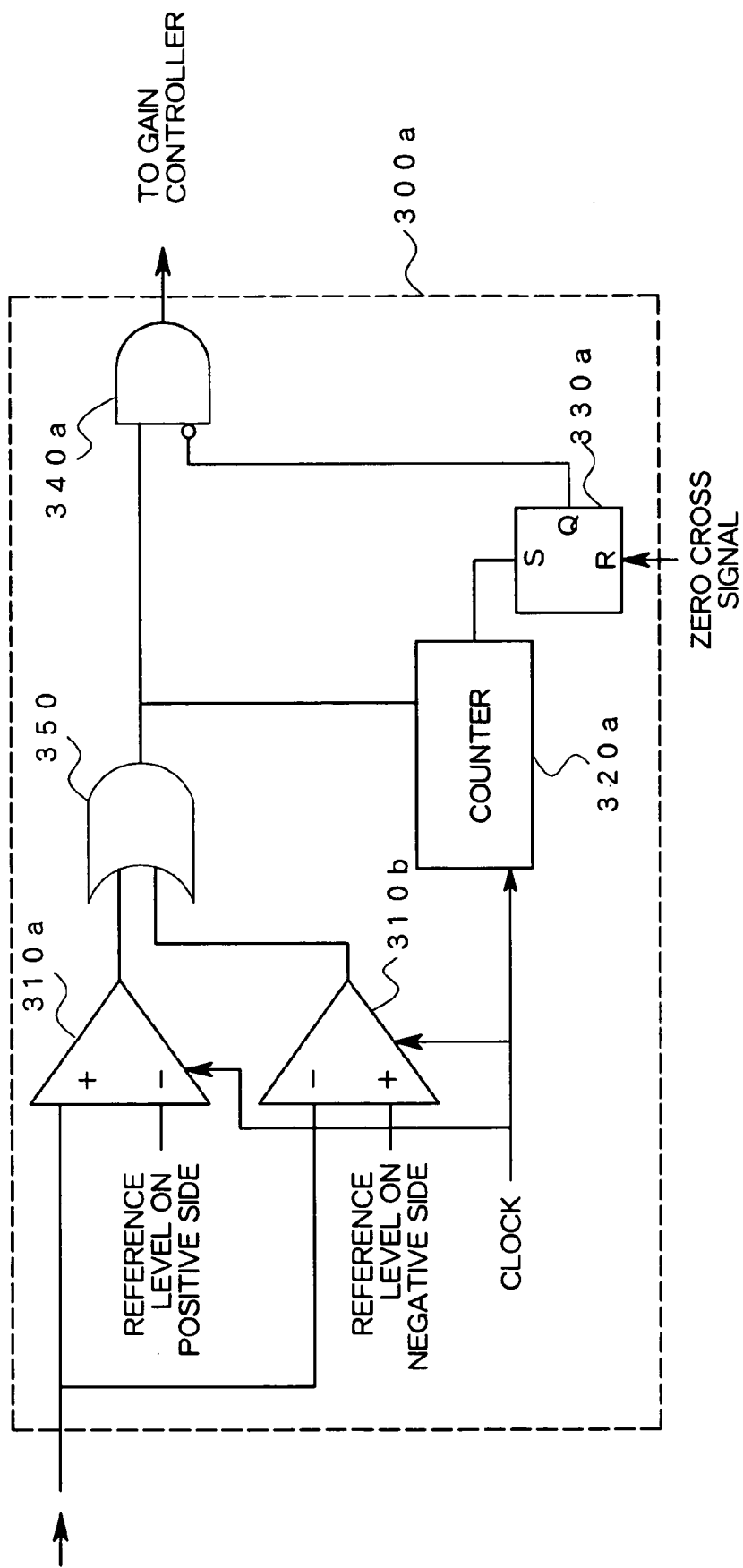
FIG. 5 is a schematic diagram showing a configuration of the attack detecting circuit installed in the level detector in the automatic level control circuit of FIG. 4.

FIG. 4 shows a schematic configuration of an automatic level control circuit in a digital detection system using a programmable gain amplifier according to a second embodiment of the present invention, and FIG. 5 shows a schematic configuration of an attack detecting circuit provided to the level detector in the automatic level control circuit of FIG. 4. The automatic level control circuit of FIG. 4 includes, in the level detector 31a, an attack detecting circuit 300a which restricts the attenuation amount of the gain achieved at the zero crossing time, to thereby prevent excessive reduction in gain of the programmable gain amplifier 10.

In the level detector 31a, a first voltage comparator 310a compares the level of input analog voltage with a predetermined reference voltage level (reference level on the positive side) at a timing according to the clock signal. When the level of input analog voltage is found to be greater than the reference level on the positive side, a comparison result signal (of H level) as shown in FIG. 3 indicating the comparison result is output from the first voltage comparator 310a. Similarly, level comparison between the level of input analog voltage and a predetermined reference voltage level (a reference level on the negative side) is performed in a second voltage comparator 310b at the timing according to the clock signal. When the level of the input analog voltage is found to be smaller than the reference level, the comparison result signal (of H level) as shown in FIG. 3 indicating the comparison result is output from the second voltage comparator 310b. The comparison result signals (H level) output from the first and second voltage comparators 310a and 310b are input into an OR circuit 350, and the comparison result signal obtained from the OR circuit 350 (H level) is input into the AND circuit 340a.

Further, in the counter 320a, the comparison result signal (H level) output from the OR circuit 350 is counted at a timing according to the clock signal. When the count of the comparison results which is incremented at this time reaches the number of comparison results equivalent to the predetermined maximum number of steps in which the gain can be changed at the zero crossing time, the SR flip flop 330a is set. After the SR flip flop 330a is set, the mask signal output from the SR flip flop 330a becomes H level, as in the case illustrated in FIG. 3, and an inverted output of the mask signal is input in the AND circuit 340a. Thus, the comparison result signals from the first and the second voltage comparators 310a and 310b and the inverted output of the mask signal are input into the AND circuit 340a in which an AND among the comparison result signals and the inverted output of the mask signal is obtained. Then, the attack detection output signal similar to that of FIG. 3 is output as a detection result to the gain controller 40.

It should be noted that the SR flip flop 330a is configured to be reset when the edge of the zero cross signal (H level) is input from the zero cross detector 50. Accordingly, the SR flip flop 330 is reset at the subsequent zero crossing time, and, from then on, the normal attack action is repeated until the number of counts registered in the counter 320a reaches the count of comparison results equivalent to the predetermined maximum steps. When the count of comparison results equivalent to the predetermined maximum steps is attained, similarly as in the previous example, the attack detection output signal masked by the mask signal is output, as the detection result, to the gain controller 40, thereby restricting the attack action.

By configuring the attack detecting circuit 300a as described above, even an automatic level control circuit having a structure in which an analog signal from the programmable gain amplifier 10 is input into the level detector 31a can produce the effects similar to those obtained by the automatic level control circuit according to the first embodiment of the present invention.

What is claimed is:

1. An automatic level control circuit comprising:
   a gain controllable amplifier which amplifies an input signal according to an established gain;
   a comparing and outputting circuit which compares a level of an output signal from the gain controllable amplifier with a reference level, and outputs a result of comparison as a comparison result signal;
   a circuit which generates a mask signal which is used, when the comparison result signal obtained in a period between one zero crossing point and another zero crossing point of the input signal is output over a predetermined output time, for restricting the comparison result signal output during the over period; and
   an outputting circuit of an attack detecting and outputting signal which, when the comparison result signal is output over the predetermined output time, restricts the comparison result signal output from the comparing and outputting circuit during the period over the predetermined output period and outputs the restricted comparison result signal as an attack detecting and outputting signal in accordance with the mask signal, and which, during the predetermined output period, outputs the comparison result signal as an attack detecting and outputting signal.

2. An automatic level control circuit according to claim 1, wherein:
   the gain controllable amplifier changes the gain in a stepwise manner, and
   the circuit which generates a mask signal stores the number of gain changeable steps in which the gain is changed in the period between the zero crossing points, and generates a mask signal which is used for restricting output of the comparison result signal exceeding an amount corresponding to a prestored number of gain changeable steps is removed.

3. An automatic level control circuit according to claim 2, wherein:
   the circuit which generates a mask signal comprises:
   a counter which counts the comparison result signal at a timing according to a clock signal, and
   a flip flop which is set according to a signal from the counter when the number of counts registered in the counter reaches the number of comparison results equivalent to the number of gain changeable steps in which the gain is changed at a zero crossing time, to thereby output a mask signal, and
   wherein the comparison result signal in which the portion of the comparison result signal exceeding the amount equivalent to the number of gain changeable steps is masked by the mask signal is output.

4. An automatic level control circuit according to claim 3, wherein the flip flop is reset by an input of a zero cross signal at the zero crossing point of the input signal.

5. An automatic level control circuit according to claim 1, wherein the outputting circuit of an attack detecting and outputting circuit is a logic circuit for obtaining an AND between the comparison result signal and an inverted signal of the mask signal.

* * * * *